United States Patent
Sydon

(10) Patent No.: US 6,175,726 B1
(45) Date of Patent: Jan. 16, 2001

(54) RECEIVER ARCHITECTURE FOR THE RECEIVING OF ANGLE-MODULATED/ ANGLE-KEYED CARRIER SIGNALS

(75) Inventor: Uwe Sydon, Schweiz (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/043,942

(22) PCT Filed: Sep. 26, 1996

(86) PCT No.: PCT/DE96/01848

§ 371 Date: Mar. 27, 1998

§ 102(e) Date: Mar. 27, 1998

(87) PCT Pub. No.: WO97/12446

PCT Pub. Date: Apr. 3, 1997

(30) Foreign Application Priority Data

Sep. 29, 1995 (DE) .............................. 195 36 527

(51) Int. Cl.⁷ ...................................... H04B 1/16
(52) U.S. Cl. .................... 455/209; 455/257; 455/232.1; 455/234.2; 375/345
(58) Field of Search ............................... 455/211, 234.1, 455/245.1, 252.1, 337, 341, 323, 324, 303, 304, 314, 315, 276.1, 232.1–241.1, 257, 130, 205–210; 375/344, 345, 328, 130; 370/342

(56) References Cited

U.S. PATENT DOCUMENTS

| | | | |
|---|---|---|---|
| 3,838,350 | * 9/1974 | Ewanus et al. | 329/308 |
| 4,499,586 | * 2/1985 | Cafarella et al. | 375/98 |
| 5,249,203 | * 9/1993 | Loper | 375/344 |
| 5,323,425 | * 6/1994 | Colamonico et al. | 375/345 |
| 5,339,454 | 8/1994 | Kuo et al. | |
| 5,341,114 | * 8/1994 | Calviello et al. | 333/17.2 |
| 5,445,985 | * 8/1995 | Calviello et al. | 437/51 |
| 5,566,201 | * 10/1996 | Ostman | 375/130 |
| 5,627,857 | * 5/1997 | Wilson | 375/219 |
| 5,821,825 | * 10/1998 | Kobayashi | 331/66 |
| 5,857,004 | * 1/1999 | Abe | 375/344 |

FOREIGN PATENT DOCUMENTS

| | | |
|---|---|---|
| 0 637 130 A2 | 2/1995 | (EP) . |
| 2 286 950 | 8/1995 | (GB) . |
| WO 94/10764 | 5/1994 | (WO) . |
| WO 94/10812 | 5/1994 | (WO) . |

OTHER PUBLICATIONS

Informatik Spektrum, 14 (1991) A. Mann, Der GSM–Standard, Grundlage für digitale europäische Mobilfunknetze, p. 137–152.

Nachrichtentechnik Elektronik, vol. 42, No. 1, (1992) Ulrich Pilger, Struktur des DECT–Standards, pp. 23–29.

ntz Bd. 46 (1993) No. 10, Simon Atkinson, Architekturen für ein Dect–Sende–und Empfangsteil: Ein Vergleich, pp. 754–757.

ILP Conference, Mar. 9, 1995, University of California, Berkeley, T. Weigandt et al, Integrated VCO/Synthesizer for DECT/Multi–Standard RF Modems: Slide 1 of 20, 5 pp.

InfoPad Retreat, Jan. 9–11, 1995, University of California, Berkeley, T. Weigandt et al, Frequency Synthesis for a Monolithic CMOS RF Transceiver: Slide 1 of 17, 5 pp.

* cited by examiner

*Primary Examiner*—Dwayne D. Bost
*Assistant Examiner*—Charles Craver
(74) *Attorney, Agent, or Firm*—Schiff Hardin & Waite

(57) ABSTRACT

Carrier signals received by a receiver architecture for an amplitude spectrum of the carrier signal prescribed by the employment of the receiver architecture even given small modulation indices, a low-noise amplifier (VS) preceding a synthesizer (SYN) of the receiver is either turned off dependent on the field strength received with the carrier signal or is fashioned such that the maximum output power of the amplifier (VS) at the possible amplitude spectrum of the carrier signal never lies above the compression point of the mixer/mixers in the synthesizer (SYN).

5 Claims, 2 Drawing Sheets

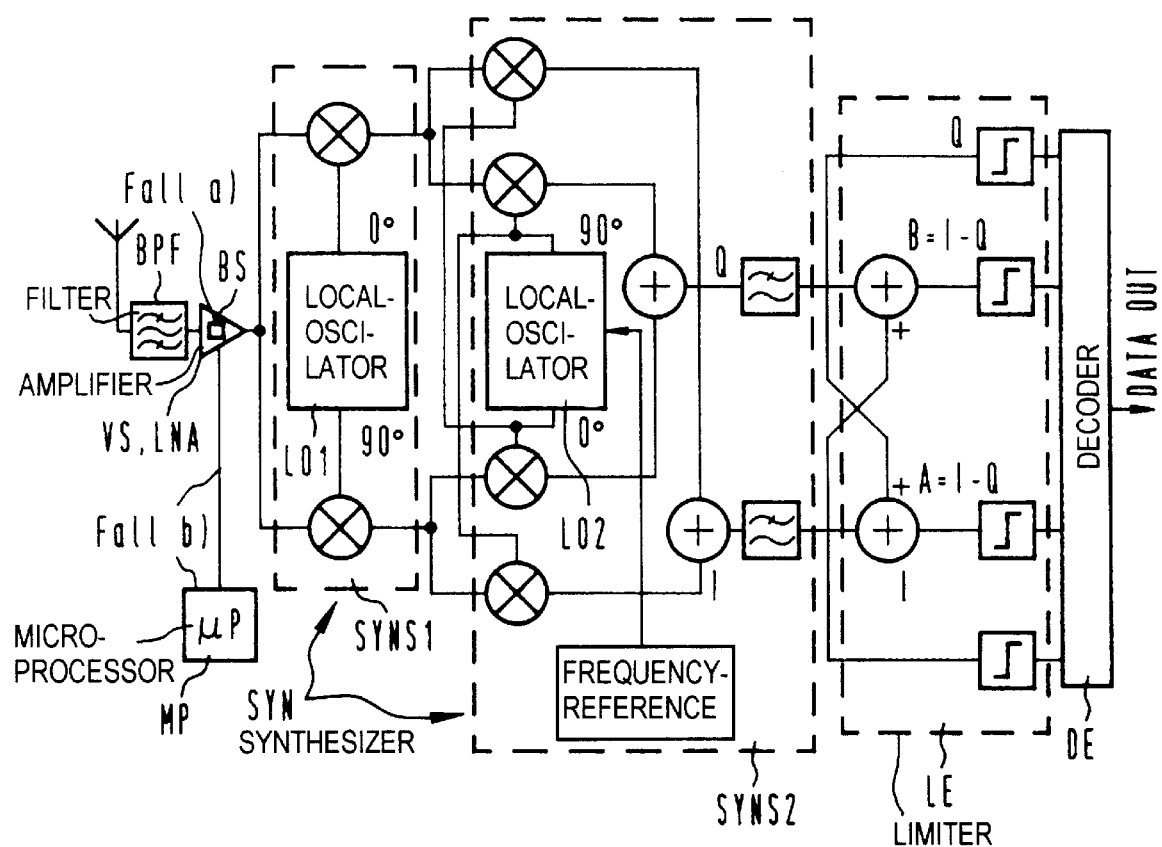

RECEIVER ARCHITECTURE FOR THE RECEIVING OF ANGLE-MODULATED/ANGLE-KEYED CARRIER SIGNALS

BACKGROUND OF THE INVENTION

The invention is directed to a receiver for the reception of angle-modulated/angle-keyed carrier signals.

Receivers of the type referred to above are utilized everywhere in communications technology where an HF signal serving as carrier and connected by modulation with an analog or digital LF signal containing the information to be transmitted is in turn to be edited. A distinction is made between an analog or digital modulation or, respectively, demodulation type dependent on the employment of an analog or of a digital LF signal. The term "keying" is employed for the digital modulation or, respectively, demodulation for distinguishing between the two types.

There are respectively different modulation or, respectively, demodulation forms for each modulation or, respectively, demodulation type (analog or digital). A distinction is thereby made between an amplitude, frequency and phase modulation or, respectively, amplitude, frequency and phase demodulation. Over and above this, thereby are numerous derivatives of the aforementioned modulation or, respectively, demodulation forms (for example, GFSK, GMSK, etc.), particularly given the digital modulation or, respectively, demodulation type. Frequency and phase modulation or, respectively, frequency and phase demodulation is also referred to as angle modulation or, respectively, demodulation.

The above comments refer to a single HF signal to be modulated or, respectively, demodulated that is available to a limited subscriber circle for the message transmission in a message system, for example in a mobile radiotelephone system or cordless telecommunication system.

In order to augment the subscriber circle, the plurality of dimensions for the analog or digital modulation or, respectively, demodulation is increased. The time and/or frequency domain are preferably utilized therefor. Alternatively thereto, it is also possible to additionally utilize the transmission channel defined by the time and frequency domain with different codings. In the utilization of the time and/or frequency domain, one speaks of a TDMA and/or FDMA method (Time Division Multiple Access; Frequency Division Multiple Access). In the utilization of the time and frequency domain in conjunction with the employment of different codings, one speaks of a CDMA method (Code Division Multiple Access).

Receiver architectures for receiving angle-keyed carrier signals whose frequencies lie in a frequency band between 890 MHz and 960 MHz given a GSM system and in a frequency band between 1880 MHz and 1900 MHz in a DECT system are therefore utilized in mobile radiotelephone technology according to the GSM standard (Groupe Speciale Mobile or Global System for Mobile Communication; see Informatik Spektrum 14 (June 1999) No.3, Berlin, A. Mann, "Der GSM-Standard—Grundlage für digitale europäische Mobilfunknetze", pages 137 through 152), including the derivative DCS1800 and the American version ADC and Japanese version JDC, as well as in the cordless telecommunications technology according to the DECT standard (Digital European Cordless Telecommunication, see Nachrichtentechnik Elektronik 42 (Jan/Feb 1992), No.1, Berlin, U. Pilger, "Struktur des DECT-Standards", pages 23 through 29), including the American version WCPS, the CT2 and CT3 standard (Cordless Telecommunication).

When building a receiver—for example, for the aforementioned systems—one generally distinguishes between a homodyne receiver (direct receiver) or heterodyne receivers (double detection receivers) with single or double frequency conversion. Compared to heterodyne receivers, the homodyne receiver has the advantage that the homodyne receiver can be more highly integrated. Compared to the homodyne receivers, the heterodyne receiver has the advantages that the selectivity can be easily defined by a band-pass filter at the intermediate frequency and the frequency of the variable oscillator, and that the demodulation occurs at a relatively low frequency. The homodyne receiver, moreover, is not especially well-suited for TDMA systems because the majority of the system amplification is undertaken in the baseband amplifier. These amplifiers, however, react to very low frequency signals and are therefore very sensitive to transient responses that arise due to switching between a transmission mode and a reception mode in the TDMA systems (see ntz, Vol. 46 (1993) No. 10, pages 754 through 757).

FIG. 1 shows a homodyne receiver (direct conversion receiver) disclosed by Great Britain Reference GB-2,286,950 A1 that contains a one-stage synthesizer SYN typical for homodyne receivers with a preceding, low-noise amplifier VS and band-pass filter BPF and with a following limiting means LE and decoder means DE. Two further components (for example, an A-component and a B-component) can be generated with the limiting means LE for an "In Phase" component (I-component) and a quadrature component (Q-component) of the signal to be demodulated, being formed by addition or, respectively, subtraction of the I-component and Q-component. As a result thereof, the angle resolution is enhanced in the complex I/Q level. For the demodulation in the decoder means, further, the components (signals) are limited hard (limited), as a result whereof the statusses "1" or "−1" arise for the I, Q, A and B components.

An angle-keyed signal (for example, the GFSK signal) can have an arbitrary angle in the complex level. The current frequency of the carrier is modified by $+\Delta f$ or, respectively, by $-\Delta f$ in GFSK modulation for the transmission of digital information. The modification by $+\Delta f$ thereby corresponds, for example, to a logical "1", whereas the modification by $-\Delta f$, logically, corresponds to a logical "0". In the complex level, the frequency shift/modification $\pm\Delta f$ corresponds to a rotation of the pointer by $\Delta\phi$ in clockwise direction (for example, given a logical "1") or, respectively, in counter clockwise direction (for example, given a logical "0"). The amount of the angle change (frequency change) is thereby dependent on the modulation index employed. At least one further coordinate system is generated in order to also be able to identify slight angle changes of the pointer in the I/Q level. For example, this additional coordinate system is formed by the A-component and B-component.

FIG. 2 shows the complex level with the unit circle and two coordinate systems, the I/Q coordinate system and the A/B coordinate system, that are shifted by 45° relative to one another. As a result thereof, the unit circle is divided into eight sectors of equal size. Four quadrants I, II, III, IV in which the pointer can be located can be recognized with each of the two coordinate systems. Two sectors for the possible position of the pointer thus derive in each coordinate system. The actual position of the pointer derives from the meet of two sectors. This is demonstrated with reference to the following example:

A signal to be demodulated or, respectively, decoded exhibits the following status values for the I, Q, A and B components: I=1; Q=1; A=1; B=−1.

According to FIG. 1, the sectors 1 and 2 are possible in this case for the I/Q coordinate system.

According to FIG. 1, the sectors 1 and 8 are possible in this case for the A/B coordinate system. The common meet is the sector 1.

Analogous thereto, the allocations "sector—I,Q,A,B status values" can be identified for the other sectors, these being shown in the following table.

| I  | Q  | A  | B  | Sector No. |
|----|----|----|----|------------|
| 1  | 1  | 1  | −1 | 1          |
| 1  | 1  | 1  | 1  | 2          |
| 1  | −1 | 1  | 1  | 3          |
| 1  | −1 | −1 | 1  | 4          |
| −1 | −1 | −1 | 1  | 5          |
| −1 | −1 | −1 | −1 | 6          |
| −1 | 1  | −1 | −1 | 7          |
| −1 | 1  | 1  | −1 | 8          |

All other value combinations are inadmissible.

As already mentioned, the information to be decoded (useful information) is contained in the rotational sense of the pointer. This rotational sense derives from the current position (current sector) and the previous position (previous sector). The current sector must therefore be compared to the previous sector for the demodulation. The rotational sense derives therefrom, as, thus, does the decision as to whether a logical "0" or a logical "1" was sent. The demodulation is thus reduced to the comparison to a table for determining the current sector and a comparison of this sector to the preceding sector.

The reconstruction of the data is possible when the modulation index is big enough in order to see to it that a sector is always transgressed or, stated differently, the plurality of sectors (and, thus, the angle resolution) is to be selected such that the minimum angle change (dependent on the modulation index) always produces a change in sector.

The demodulation of an angle modulated/keyed carrier signal with the receiver disclosed by Great Britain Reference GB-2,286,950 A1 and the above-described demodulation principle, which can likewise be derived from this publication, is only possible for a limited amplitude spectrum of the carrier signal. The reason for this is that the mixers 28, 30 in FIG. 3 of Great Britain GB-2,286,950 A1 limit the signal given certain signal amplitudes, and an evaluation of the amplitude information contained in the I-component and Q-component is therefore no longer possible for generating the A-component and B-component.

European Reference EP-0 637 130 A2 discloses a receiver wherein, due to an automatic gain control (AGC), the carrier signals arriving at a mixer stage are controlled such with respect to their amplitude that a limiting effect does not occur in the mixer stage.

Quasi-homodyne receivers that respectively comprise a two-stage synthesizer have been presented at the ILP Conference, Mar. 9, 1995, University of California, Berkeley, T. Weigandt, S. Mehta, P. R. Gray, "integrated VCO/Synthesizer for DECT/Multi-Standard RF Modems", and at the InfoPad Retreat Conference, Jan. 9–1995, University of California, Berkeley, T. Weigandt, S. Mehta, P. R. Gray, "Frequency Synthesis for a Monolithic CMOS RF Transceiver", whereby a first synthesizer stage is operated with a constant frequency and a second synthesizer stage following the first synthesizer stage is operated with a variable frequency.

SUMMARY OF THE INVENTORY

The object underlying the invention is comprised in specifying a receiver for the reception of angle-modulated/keyed carrier signals that unites the advantage of the high degree of integration in a homodyne receiver with the advantages of a heterodyne receiver and whereby, even given small modulation indices, the carrier signals can be demodulated/decoded for an amplitude spectrum possible due to the employment of receiver.

In general terms the present invention is a receiver for the reception of angle modulated/keyed carrier signals. A synthesizer for the synthetic generation of a base signal to be demodulated/decoded and having an I-component and a Q-component from the carrier signal. A low-noise amplifier precedes the synthesizer. Means for generating additional components of the base signal are fashioned such that, based on the evaluation of an amplitude information contained in the I-component and Q-component, at least one A-component phase-shifted relative to the I-component of the base signal and one B-component phase-shifted relative to the Q-component of the base signal are generated. The synthesizer is fashioned two-stage, whereby control means are allocated to the amplifier with which all carrier signals contained within a possible amplitude spectrum and pending at the input side of the amplifier are amplified to an amplitude of a signal output at the output side of the amplifier to the synthesizer. The amplitude is adequate for the generation of the A-component and of the B-component. The control means are fashioned as a microprocessor allocated to the amplifier that turns the amplifier on or, respectively, off dependent on the amplitude of the carrier signal adjacent at the input side of the amplifier such that the predetermined amplitude is not exceeded.

Advantageous developments of the present invention are as follows.

The control means are fashioned as a limiting circuit arranged in the amplifier that limits the gain of the amplifier to the amplitude adequate for the generation of the A-component and the B-component.

The control means are fashioned as a microprocessor allocated to the amplifier that turns the amplifier on or, respectively, off dependent on the amplitude of the carrier signal adjacent at the input side of the amplifier such that the amplitude adequate for the generation of the A-component and B-component is not exceeded.

The receiver can be used in a DECT-specific cordless telecommunication system, as well as, in a GSM-specific mobile radiotelephone telecommunication system.

The idea underlying the invention is that either the low-noise amplifier preceding the two-stage synthesizer of the receiver is turned on and off dependent on the amplitude of the received carrier signal that is adjacent at the input side of the amplifier (for example, by a microprocessor that, for example, evaluates the field strength of the carrier signal) and, as a result thereof, the mixer/mixers in the synthesizer is/are no longer driven into limitation or the amplifier is fashioned such (for example, with an internal limiting circuit) that the maximum output power of the amplifier at the possible amplitude spectrum of the carrier signal never lies above the compression point of the mixer/mixers in the synthesizer. The fact that the amplifier limits in this case is unproblematical because the carrier signal has a constant envelope at this point in time.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 3 is a block diagram of the present invention.

DESCRIPTION OF THE PREFERRED EMBODIMENTS

Figure 1:
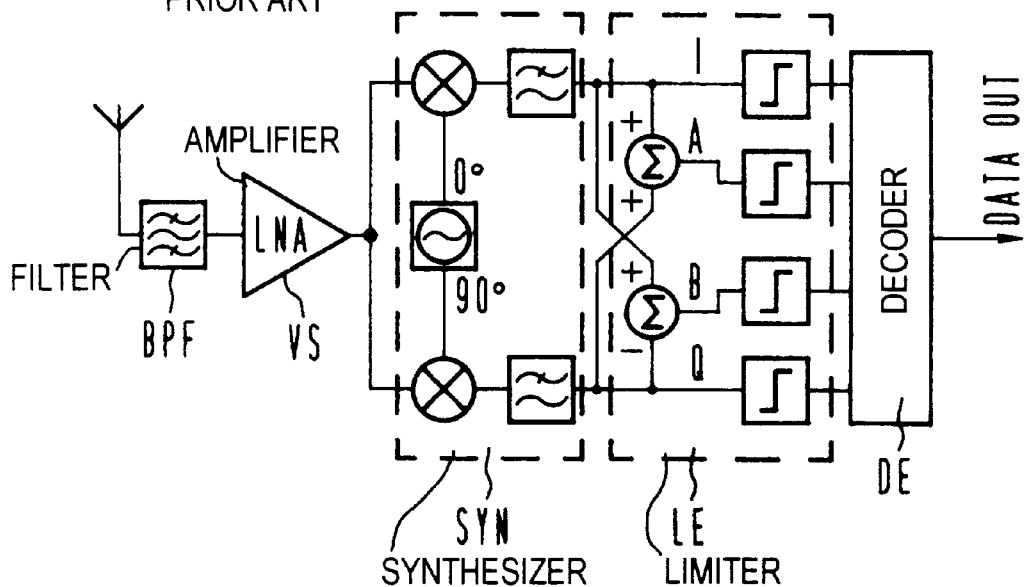
FIG. 1 is a block diagram of a prior art homodyne receiver.
Figure 2:
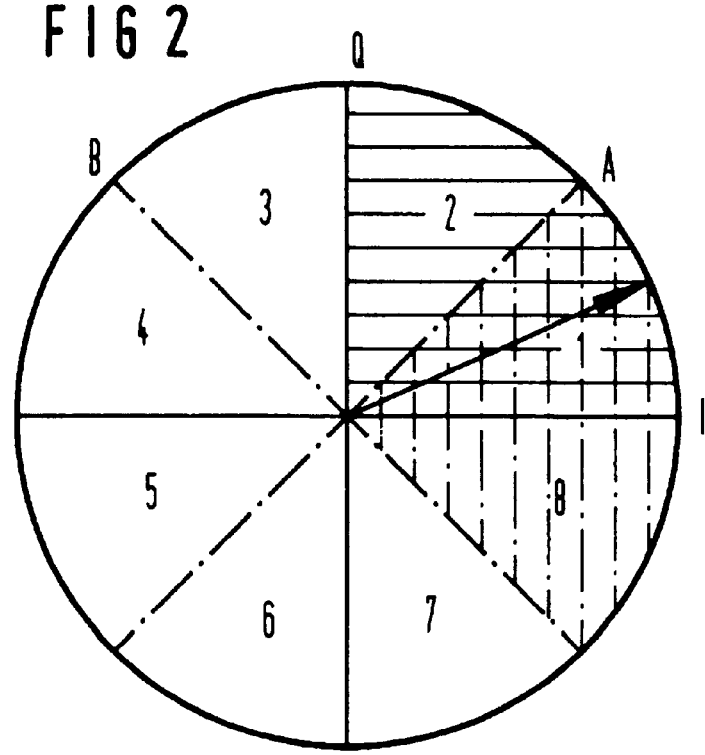
FIG. 2 depicts the I/Q coordinate system and the A/B coordinate system.

Proceeding from the known homodyne receiver according to FIG. 1, FIG. 3 shows a receiver modified with respect to the synthesizer SYN that unites the advantages of a homodyne receiver with those of a heterodyne receiver. The receiver shown in FIG. 3 is therefore also referred to as quasi-homodyne receiver. In order to achieve the high degree of integration characteristic of homodyne receivers with the receiver shown in FIG. 3, the local oscillators for the frequency conversion, which are typical for a homodyne and heterodyne receiver, must be integrated (complete integration).

The problem thereby arises that the realization of the required phase noise of the oscillator is inadequate. In order to avoid this problem, a first local oscillator LO1 of a first synthesizer stage SYNS1 in the synthesizer SYN is operated at a fixed frequency. As a result thereof, the bandwidth of the synthesizer SYN can be selected very big, so that the phase noise in the range of interest is essentially determined by the stability of a reference oscillator (not shown in FIG. 3) that is employed.

Since the first local oscillator LO1 is not variable in frequency, the direct conversion architecture typical of the homodyne receiver is not possible due to the lacking channel selection. The signal received via the antenna, filtered in the band-pass filter BPF and amplified in the low-noise amplifier VS (Low Noise Amplifier), for example the DECT signal given a DECT receiver, is therefore converted onto an intermediate frequency in the first synthesizer stage SYNS1. By contrast to known heterodyne receivers, however, a channel selection is thereby not implemented. In order to suppress the mirror frequencies arising in the conversion of the reception signal onto the intermediate frequency, a mixer arrangement MA (configuration) with respect to the mixers employed in this stage is employed in a second synthesizer stage SYNS2 following the first synthesizer stage SYNS1, this mixer arrangement MA converting the reception signal converted onto the intermediate frequency into the baseband and thereby simultaneously suppressing the mirror frequencies that arose in the first synthesizer stage SYNS1. The configuration for the mirror frequency suppression is also referred to as "Image Rejection Mixer" configuration. For the suppression of the mirror frequencies, the mixer arrangement MA in the second synthesizer stage SYNS2 is thereby operated by a second local oscillator LO2 that, differing from the first local oscillator LO1, is variable in frequency. As a result thereof, the channel selection or, respectively, channel selecting already addressed above is realized.

The components formed by the mixer arrangement for the mirror frequency suppression are combined at the output of the second synthesizer stage SYNS2 to form an I-component and a Q-component, analogous to the conditions given homodyne receivers. The channel selection in the baseband is subsequently realized by low-pass filters in the I-branch and Q-branch, as in the known homodyne receiver of FIG. 1.

Additional components, an A-component and a B-component, can be generated—in conformity with Great Britain reference GB-2,286,950 A1—by weighted addition or, respectively, subtraction of the I-component and Q-component with the limiting means LE following thereupon. The angle resolution in the complex level can be enhanced by a coordinate system additionally obtained in the complex level in this way. Reception signals with a small modulation index can thus also be decoded in the decoder means DE with this improved angle resolution.

So that the filtered reception signal—for example, the DECT signal —amplified by the amplifier VS is not limited by the following mixers of the first synthesizer stage SYNS1 given high signal amplitudes of the reception signal and the amplitude information for the initially described formation of the A-component and B-component is not lost as a result thereof, the amplifier VS comprises a) a limiting circuit BS that is fashioned such that the maximum output power of the amplifier VS at the possible amplitude spectrum of the reception signal never lies above the compression point of the following mixers, or b) a connection to a microprocessor MP that shuts off the amplifier VS given high signal amplitudes of the reception signal, for example on the basis of the evaluation of measured field strengths of the reception signal.

When the receiver shown in FIG. 3 is utilized, for example according to International reference WO 94/10764 or International reference WO 94/10812, in the radio part of a DECT base station of a DECT telecommunication system, the microprocessor MP can, for example, then be the DECT controller DECT-C shown in FIG. 1 of WO 94/10764 or the DECT controller or, respectively, main controller M-CT shown in FIG. 1 of International reference WO 94/10812.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A receiver for reception of angle modulated/keyed carrier signals, comprising:

a synthesizer for synthetic generation of a base signal to be demodulated/decoded and having an I-component and a Q-component from a carrier signal:

a low-noise amplifier that precedes the synthesizer;

generator for generating additional components of the base signal, the generator being structured such that, based on an evaluation of amplitude information contained in the I-component and Q-component, at least one A-component, phase-shifted relative to the I-component of the base signal, and one B-component, phase-shifted relative to the Q-component of the base signal, are generated;

the synthesizer being a two-stage synthesizer;

a first synthesizer stage for synthetic generation of the I-component and of the Q-component from the carrier signal, said first synthesizer stage having a first local oscillator operated with a constant frequency;

a second synthesizer stage following the first synthesizer stage, said second synthesizer stage having a second local oscillator adjustable with a variable frequency and a mixer arrangement for suppression of mirror frequencies in a synthetic generation of a base signal to be demodulated/decoded;

the amplifier having a controller with which all carrier signals contained within an amplitude spectrum and pending at an input side of the amplifier are amplified to an amplitude of a signal output at an output side of the amplifier to the synthesizer, said amplitude allowing generation of the A-component and of the B-component.

2. The receiver according to claim 1, wherein the controller is a limiting circuit arranged in the amplifier that limits gain of the amplifier to the amplitude for the generation of the A-component and the B-component.

3. The receiver according to claim 1, wherein the controller is a microprocessor allocated to the amplifier that turns the amplifier on or, respectively, off dependent on the amplitude of the carrier signal at the input side of the amplifier such that a minimum amplitude for the generation of the A-component and B-component is not exceeded.

4. The receiver according to claim 1 wherein the receiver is utilized in a DECT-specific cordless telecommunication system.

5. The receiver according to claim 1, wherein the receiver is utilized in a GSM-specific mobile radiotelephone telecommunication system.

* * * * *